United States Patent [19]
Arimoto

[11] Patent Number: 6,100,563
[45] Date of Patent: Aug. 8, 2000

[54] SEMICONDUCTOR DEVICE FORMED ON SOI SUBSTRATE

[75] Inventor: Kazutami Arimoto, Hyogo, Japan

[73] Assignee: Mitsubishi Denki Kabushiki Kaisha, Tokyo, Japan

[21] Appl. No.: 09/080,257

[22] Filed: May 18, 1998

Related U.S. Application Data

[63] Continuation of application No. 08/762,619, Dec. 6, 1996.

[30] Foreign Application Priority Data

May 30, 1996 [JP] Japan .................................. 8-136937

[51] Int. Cl.[7] .................................................. H01L 27/01
[52] U.S. Cl. ......................... 257/347; 257/368; 257/901
[58] Field of Search ..................... 257/347, 350, 257/369, 351, 368, 372, 373, 901; 327/537; 326/33

[56] References Cited

U.S. PATENT DOCUMENTS

| | | | |
|---|---|---|---|
| 5,557,231 | 9/1996 | Yamaguchi et al. | 327/534 |
| 5,659,517 | 8/1997 | Armoto et al. | 365/226 |
| 5,770,881 | 6/1998 | Pelella et al. | 257/348 |
| 5,838,047 | 11/1998 | Yamauchi et al. | 257/372 |

FOREIGN PATENT DOCUMENTS

| | | |
|---|---|---|
| 7-86917 | 3/1995 | Japan . |
| 9-8645 | 1/1997 | Japan . |
| 9-73784 | 3/1997 | Japan . |
| 97-3198 | 1/1997 | Rep. of Korea . |
| 97-17598 | 4/1997 | Rep. of Korea . |

OTHER PUBLICATIONS

"Switched–Source–Impedance CMOS Circuit for Low Standby Subthreshold Current GIGA–Scale LSI's", Horiguchi et al., 1993 Symposium on VLSI Circuit Dig. of Tech. Papers, pp. 47–48., Dec. 1993.

"Stand–by/Active Mode Logic For Sub–1 V 1G/4Gb DRAMS", Takashima et al., 1993 Symposium on VLSI Circuit Dig. of Tech. Papers, pp. 83–84., Dec. 1993.

"Leakage Mechanism Due to Floating Body and Countermeasure on Dynamic Retention of Mode of SOI–DRAM", F. Morishita et al., 1995 pp. 141–142, Dec. 1995.

"1V High–Speed Digital Circuit Technology With $0.5\mu m$ Multi–Threshold CMOS", Shinichiro Mutoh et al., 1993 pp. 186–189., Dec. 1993.

Patent Abstracts of Japan, JP 08083487 A, Mar. 26, 1996 to Sato et al.

"A 4–Mb Pseudo Static SRAM Operating at 2.6+–1 V With $3-\mu A$ Data Retention Current", IEEE Journal of Solid–State–Circuits, vol. 26, No. 11, 1991 pp. 1556–1561., Dec. 1991.

*Primary Examiner*—Mark V. Prenty
*Attorney, Agent, or Firm*—McDermott, Will & Emery

[57] ABSTRACT

In an integrated semiconductor device formed on an SOI substrate, first and second switches are switched at a predetermined cycle in a standby mode period to apply a boosted potential Vpp and a negative potential Vbb to the source of a p channel MOS transistor and an n channel MOS transistor, respectively, of a row of inverters. The charge stored in the body region of the MOS transistor is discharged to prevent reduction of the body potential of the MOS transistor and increase of the body potential of the MOS transistor to lower subthreshold leakage current. The layout area is reduced comparable to the case where the body potential is fixed by a contact region.

20 Claims, 7 Drawing Sheets

SEMICONDUCTOR DEVICE FORMED ON SOI SUBSTRATE

This application is a continuation of application Ser. No. 08/762,619 filed Dec. 6, 1996.

BACKGROUND OF THE INVENTION

1. Field of the Invention

The present invention relates to semiconductor devices, and more particularly, to a semiconductor device formed on an SOI (Silicon On Insulator) substrate, having a standby mode and an active mode.

2. Description of the Background Art

Figure 13:
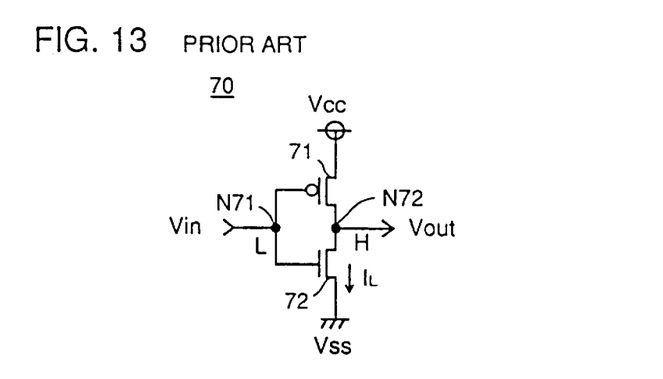
FIG. 13 is a circuit diagram showing a structure of a CMOS inverter of a conventional integrated semiconductor device.

FIG. 13 is a circuit diagram showing a structure of a CMOS inverter 70 of a conventional integrated semiconductor device (DRAM, SRAM, and the like) formed on an SOI substrate. Referring to FIG. 13, CMOS inverter 70 includes an input node N71, an output node N72, a p channel MOS transistor 71, and an n channel MOS transistor 72. An input signal Vin is applied to input node N71. An output signal Vout is provided from output node N72. P channel MOS transistor 71 has its gate connected to input node 71, a source receiving a power supply potential Vcc, and a drain connected to output node N72. N channel MOS transistor has its gate connected to input node N71, its drain connected to output node N72, and its source grounded. The bodies of MOS transistor 71 and 72 are both set to a floating state.

Figure 14A:
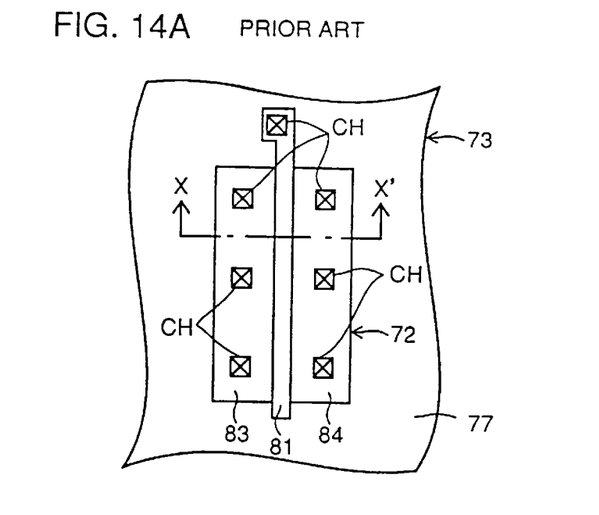
FIG. 14A shows a device structure of the n channel MOS transistor of FIG. 13.
Figure 14B:
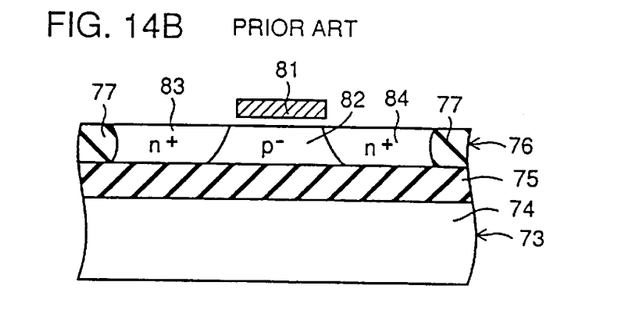
FIG. 14B is a sectional view of the n channel MOS transistor of FIG. 14 taken along line X–X'.

FIG. 14A is a partially broken away plan view of a device structure of n channel MOS transistor 72 shown in FIG. 13. FIG. 14B is a sectional view of n channel MOS transistor 72 of FIG. 14A taken along line X–X'. Referring to FIGS. 14A and 14B, n channel MOS transistor 72 is formed on SiO substrate 73. SOI substrate 73 includes a silicon substrate 74, an SiO buried oxide layer 75 and a p⁻ type silicon layer 76 stacked thereon. The element region of n channel MOS transistor 72 is isolated from other element regions by an SiO insulation layer 77 which is an oxidized p⁻ type silicon layer 76.

A gate electrode 81 is formed above the center portion of the element region with a gate oxide film therebetween (not shown). The portion of p⁻ type silicon layer 76 covered by gate electrode 81 is a body region 82. An n⁺ type drain region 83 and an n⁺ type source region 84 are formed at one side and the other side, respectively, of gate electrode 81. Gate electrode 81 is connected to input node N71. N⁺ type drain region 83 is connected output node N72 via a contact hole CH. N⁺ type source region 84 is grounded via contact hole CH. The device structure of p channel MOS transistor 71 is similar to that of n channel MOS transistor 72 provided that the p type and the n type are opposite.

The operation of CMOS inverter 70 shown in FIGS. 13, 14A and 14B will be described hereinafter. In a standby mode period where input signal Vin attains an L level (ground level Vss), p channel MOS transistor 71 is rendered conductive and n channel MOS transistor 72 is rendered non-conductive, whereby output signal Vout attains an H level (power supply level Vcc). When input signal Vin rises to an H level in an active mode period, p channel MOS transistor 71 is rendered non-conductive, and n channel MOS transistor 72 is rendered conductive, whereby output signal Vout attains an L level.

In such integrated semiconductor devices, research to reduce power supply voltage is in progress together with increase in the integration density. It is therefore necessary to lower the threshold voltage of the MOS transistor forming the integrated semiconductor device to increase the driving capability thereof so that the integrated semiconductor device can operate at high speed under low power supply voltage.

However, reduction of the threshold voltage of the MOS transistor corresponding to the power supply voltage will increase the subthreshold leakage current $I_L$ therein. It is not possible to reduce the threshold voltage of the MOS transistor corresponding to reduction of the power supply voltage. Difficulty in increasing the performance of an integrated semiconductor device, particularly increasing the operation rate, is expected. Such problems are pointed out in, for example, 1993 Symposium on VLSI Circuit Digest of Technical Papers, pp. 47–48 and pp. 83–84.

In n channel MOS transistor 72 of CMOS inverter 70 shown in FIGS. 13, 14A and 14B, reduction in the threshold voltage will cause increase in the junction leakage current from n⁺ type drain region 83 into p⁻ type body region 82 during a standby period. This causes increase in the potential of p⁻ type body region 82, whereby the threshold leakage current $I_L$ of n channel MOS transistor 72 is increased. This phenomenon is pointed out in, for example, 1995 Symposium on VLSI Technology Digest of Technical Papers, pp. 141–142.

Figure 16:
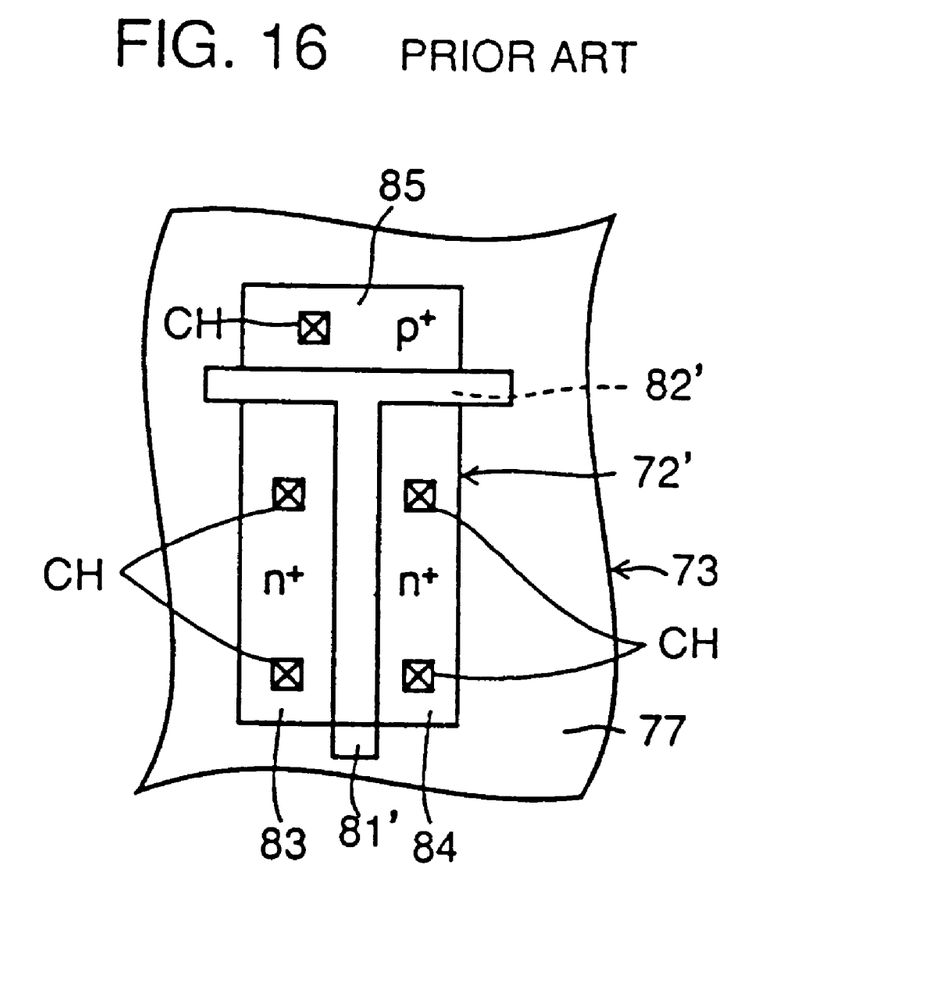
FIG. 16 shows another device structure of the n channel MOS transistor shown in FIG. 13.

One method of reducing subthreshold leakage current $I_L$ is to fix the potential of p⁻ type body region 82 of n channel MOS transistor 72. To implement this method, a T-shaped gate electrode 81' is provided, and a p⁺ type contact region 85 is provided so as to contact p⁻ type body region 82' covered with gate electrode 81, as shown in FIG. 16. The potential of p⁻ type body region 82' can be prevented from increasing by applying a constant substrate potential to p⁺ type contact region 85 via contact hole CH, whereby the threshold leakage $I_L$ can be reduced.

However, there was a problem that the layout area for providing p⁺ type contact hole region 85 is increased in this method. There was also a problem that the operation speed is delayed due to increase of the capacitance between p⁻ type body region 82 and n⁺ drain and source regions 83 and 84.

SUMMARY OF THE INVENTION

In view of the foregoing, an main object of the present invention is to provide a semiconductor device of low power consumption and small layout area.

Another object of the present invention is to provide a semiconductor device of low power consumption and high operation speed.

According to a first aspect of the present invention, a predetermined potential differing from a power supply potential is supplied to a source region of a MOS transistor at a predetermined period of a standby mode period, whereby the charge stored in a body region of the MOS transistor is discharged to lower the subthreshold leakage current. In contrast to the conventional case where the threshold leakage current is reduced by fixing a body potential by means of a contact region, the layout area can be reduced corresponding to the area of such a contact region.

Preferably, a predetermined potential is applied in a pulsive manner at a predetermined cycle to a source region of a MOS transistor in a standby mode period. Therefore, power consumption caused by supplying a predetermined potential is reduced as low as possible.

According to a second aspect of the present invention, a boosted potential and a down-converted potential are applied to sources of a p channel MOS transistor and an n channel MOS transistor, respectively, of an inversion circuit at a predetermined period of the standby mode period, whereby the charge stored in the body regions of the p channel MOS transistor and the n channel MOS transistor are discharged to reduce the subthreshold leakage current. Thus, an effect similar to that of the first aspect is obtained.

Further preferably, a boosted potential is applied in a pulsive manner at a predetermined cycle to the source of the p channel MOS transistor in a standby mode period, and a down-converted potential is supplied in a pulsive manner at predetermined cycle to the source of the n channel MOS transistor. Therefore, current consumption caused by applying a boosted potential and a down-converted potential can be suppressed as low as possible.

According to a third aspect of the present invention, an inversion circuit is provided including a p channel MOS transistor and an n channel MOS transistor connected in series between first and second sub-power supply lines. In a standby mode period, a first power supply potential is applied in a pulsive manner at a predetermined cycle to the first sub-power supply line. A second power supply potential is applied in a pulsive manner at a predetermined cycle to the second sub-power supply line. The charge stored in the bodies of the p channel MOS transistor and the n channel MOS transistor are discharged to reduce the subthreshold leakage current. Thus, an effect similar to that of the first aspect is obtained. Since the first and second sub-power supply lines can be held at a power supply potential and a down-converted potential, respectively, transition from a standby mode to an active mode is promptly carried out.

According to a fourth aspect of the present invention, sources of a p channel MOS transistor and an n channel MOS transistor out of a plurality of inversion circuits rendered non-conductive during a standby mode period are connected to first and second sub-power supply lines, respectively. At a predetermined period of a standby mode period, a boosted potential and a down-converted potential are applied to first and second sub-power supply lines, respectively, whereby charge stored in the bodies of the p channel MOS transistor and an n channel MOS transistor are discharged via each source, whereby the subthreshold leakage current is reduced. Therefore, an effect similar to that of the first aspect is obtained.

Preferably, a boosted potential is applied in a pulsive manner at a predetermined cycle to the first sub-power supply line, and a down-converted potential is applied in a pulsive manner at a predetermined cycle to the second sub-power supply line. Therefore, power consumption caused by applying a boosted potential and a down-converted potential can be suppressed as low as possible.

According to a fifth aspect of the present invention, the body potential of an MOS transistor is fixed during the predetermined period of the standby mode period, and set to a floating state at otherwise periods. Therefore, the sub-threshold leakage current in the standby mode period can be reduced, and the operation speed in an active mode period can be increased.

Preferably, the body potential of the MOS transistor is fixed in a pulsive manner at a predetermined cycle in a standby mode period. Therefore, current consumption caused by fixing the body potential can be suppressed as low as possible.

According to a sixth aspect of the present invention, a plurality of inversion circuits are provided including a p channel MS transistor and an n channel MOS transistor connected in series between first and second power supply lines. The bodies of the p channel MOS transistor and the n channel MOS transistor are fixed at a boosted potential and a down-converted potential, respectively, during a predetermined period of the standby mode period, and the bodies of the p channel MOS transistor and an n channel MOS transistor are set at a floating state at other periods. Therefore, an effect similar to that of the fifth aspect can be obtained.

According to a seventh aspect of the present invention, a plurality of inversion circuits connected in series are provided, including a p channel MOS transistor and an n channel MOS transistor connected in series between first and second sub-power supply lines. In an active mode period, a first power supply potential is applied to the first sub-power supply line from a first main power supply line. A second power supply potential is applied to the second sub-power supply line from a second main supply line. The bodies of the p channel MOS transistor and the n channel MOS transistor rendered non-conductive during the standby mode period are fixed at a boosted potential and a down-converted potential, respectively, at a predetermined period of the standby mode, and the bodies of the p channel MOS transistor and the n channel MOS transistor are set at a floating state at other periods. Therefore, an effect similar to that of the fifth aspect is obtained. Since reduction in potential of the first sub-power supply line and increase in potential of the second sub-power supply line are prevented in the standby mode period, transition from a standby mode period to an active mode period is promptly effected.

According to an eighth aspect of the present invention, sources of a p channel MOS transistor and an n channel MOS transistor of a plurality of inversion circuits rendered non-conductive in a standby mode period are connected to first and second sub-power supply lines, respectively. Sources of the p channel MOS transistor and the n channel MOS transistor rendered conductive during standby mode period are connected to first and second main power supply lines, respectively. During a predetermined period of the standby mode period, the bodies of the p channel MOS transistor and the n channel MOS transistor rendered non-conductive in a standby mode period are fixed at a boosted potential and a down-converted potential, respectively, and the bodies of the p channel MOS transistor and the n channel MOS transistor are set at a floating state at other periods. Thus, an effect similar to that of the fifth embodiment is obtained. Also, since the potential of the first sub-power supply line is reduced and the potential of the second sub-power supply line is increased in the standby mode period, the subthreshold leakage current of the p and n channel MOS transistors is further reduced.

Preferably, the bodies of the p channel MOS transistor and the n channel MOS transistor are fixed in a pulsive manner to a boosted potential and a down-converted potential, respectively, in the fifth to eighth aspects. Therefore, current consumption caused by fixing the body potential can be suppressed as low as possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1A:
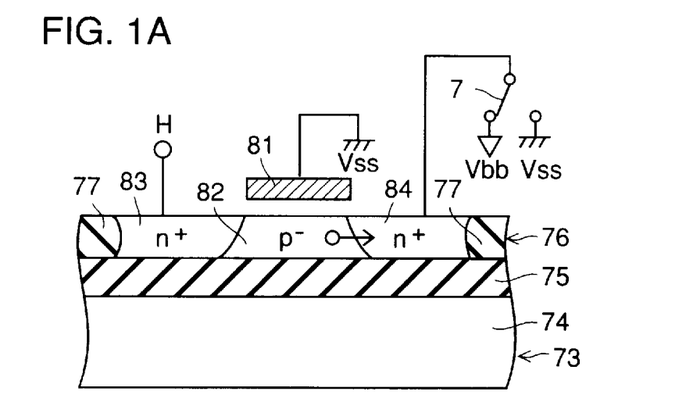
FIG. 1A is a diagram for describing the principle of a first embodiment of the present invention.
Figure 1B:
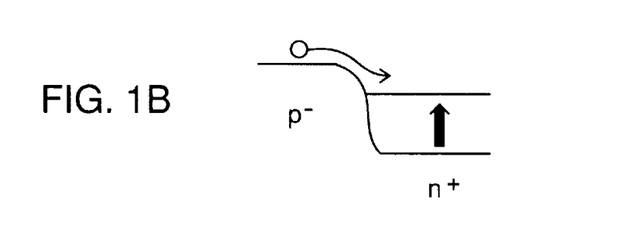
FIG. 1B shows the potential of the p⁻ type body region of and the n⁺ type source region of the n channel MOS transistor shown in FIG. 1A.
Figure 15:
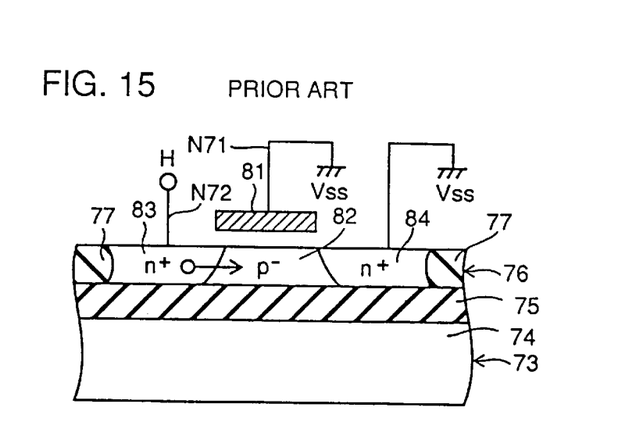
FIG. 15 is a diagram for describing problems of the circuit of FIG. 13.

FIG. 1A is comparable to FIG. 15. FIG. 1B shows the potential of a p⁻ type body region 82 and an n⁺ type source region 84 of an n channel MOS transistor 72 shown in FIG. 1A.

It was described in FIG. 15 that lowering the threshold voltage of n channel MOS transistor 72 causes increase of junction leakage current flowing from drain region 83 to body region 82 of n channel MOS transistor 72 attaining a non-conductive state in a standby mode period, whereby the potential of body region 82 rises to increase subthreshold leakage current $I_L$.

In the first embodiment of the present invention, a switch 7 is provided as shown in FIG. 1A. A negative potential Vbb (Vbb<Vss) is applied in a standby mode period and a ground potential Vss is applied as in the conventional case in an active mode period to n⁺ type source region 84 of n channel MOS transistor 72. Application of negative potential Vbb to n⁺ type source region 84 of n channel MOS transistor 72 in a standby mode period establishes a forward bias between p⁻ type body region 82 and an n⁺ type source region 84. As a result, positive charge stored in a p⁻ type body region 82 flows to an n⁺ type source region 84. The potential in the p⁻ type body region 82 is relatively reduced to lower subthreshold leakage current $I_L$. In a p channel MOS transistor attaining a non-conductive state in a standby mode period, a similar effect can be achieved by applying a boosted potential Vpp (Vpp>Vcc) to the source region thereof.

Figure 2:
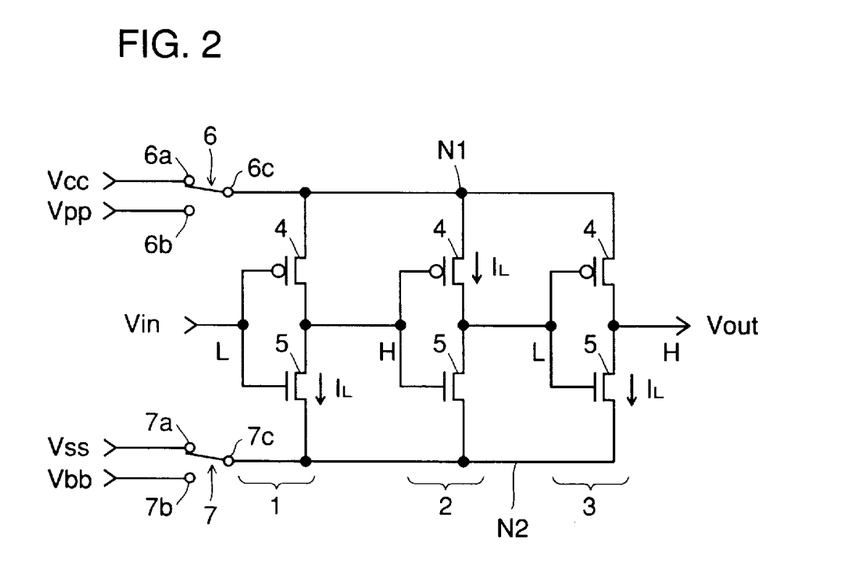
FIG. 2 is a circuit diagram showing a structure of a main component of an integrated semiconductor device in which the principle shown in FIG. 1 is applied.

Referring to FIG. 2, the integrated semiconductor device includes a plurality (three in the drawing) of CMOS inverters 1–3 connected in series, and formed on an SOI substrate, and two switches 6 and 7. Each of inverters 1–3 includes a p channel MOS transistor 4 and an n channel MOS transistor 5 connected in series between nodes N1 and N2. Input signal Vin is applied to the first stage of inverter 1, and output voltage Vout is provided from the last stage of inverter 3.

Switch 6 has its common terminal 6c connected to node N1, its one switching element 6a receiving a power supply potential Vcc, and its another switching terminal 6b receiving a boosted potential Vpp. Switch 7 has a common terminal 7c connected to node N2, its one switching terminal 7a receiving ground potential Vss, and its other switching terminal 7b receiving negative potential Vbb.

Figure 3:
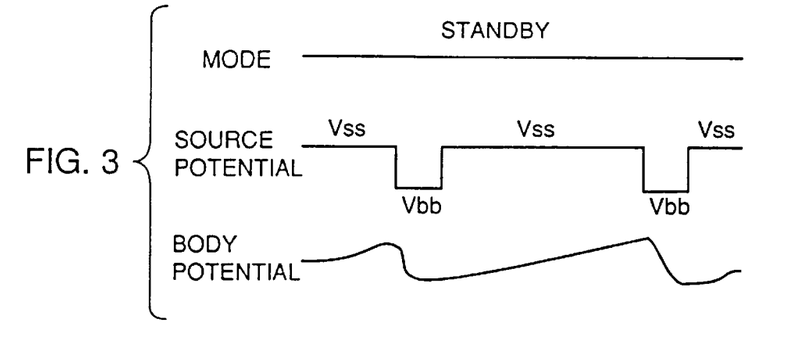
FIG. 3 is a timing chart for describing an operation of the circuit of FIG. 2.
Figure 4:
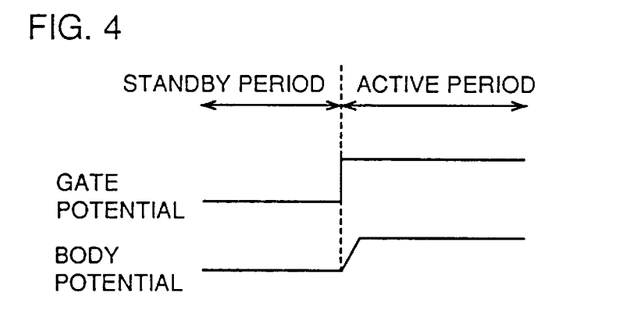
FIG. 4 is another timing chart for describing an operation of the circuit of FIG. 2.

FIGS. 3 and 4 are timing charts for describing the operation of a circuit shown in FIG. 2.

In a standby mode period, conduction is provided between terminals 6a and 6c of switch 6, and between terminals 7a and 7c of switch 7. Power supply potential Vcc and ground potential Vss are applied to nodes N1 and N2, respectively. Input signal Vin is fixed at an L level (ground potential Vss).

Therefore, P channel MOS transistor 4 of inverters 1 and 3 and n channel MOS transistor 5 of inverter 2 are rendered conductive. N channel MOS transistor 5 of inverters 1 and 3 and p channel MOS transistor 4 of inverter 2 are rendered non-conductive.

As shown in FIG. 3, the body potential of n channel MOS transistor 5 of inverters 1 and 3 gradually rises, whereby subthreshold leakage current $I_L$ increases. Here, switch 7 is switched only during a predetermined period at a predetermined cycle to apply negative potential Vbb to node N2, i.e. to the source of n channel MOS transistor 5, in a pulsive manner. As a result, positive charge stored in the body region of n channel MOS transistor 5 is drawn out via the source. The body region of n channel MOS transistor 5 is lowered, whereby subthreshold leakage current $I_L$ is reduced.

Similarly, the body potential of p channel MOS transistor 4 of inverter 2 gradually decreases, whereby subthreshold leakage current $I_L$ increases. Switch 6 is switched similarly as switch 7, whereby a boosted potential Vpp is applied to node N1, i.e., to the source of p channel MOS transistor 4, in a pulsive manner. As a result, the negative charge stored in the body region of p channel MOS transistor 4 is drawn out via the source, whereby the body region of p channel MOS transistor 4 increases to reduce subthreshold leakage current $I_L$.

In an active period, terminals 6a and 6c of switch 6 and terminals 7a and 7c of switch 7 always conduct. Nodes N1 and N2 are fixed at power supply potential Vcc and ground potential Vss, respectively.

Entering an active period, input signal Vin, i.e. the gate potential of MOS transistors 4 and 5 of inverter 1, is driven to an H level from an L level, as shown in FIG. 4. Here, the body potential of MOS transistors 4 and 5 speedily rises to an H level by coupling with the gate. P channel MOS transistor 4 is rendered non-conductive, and n channel MOS transistor 5 is rendered conductive. Inverter 1 provides an output of an L level. In response, inverter 2 provides an output of an H level, and inverter 3 provides an output of an L level. Output signal Vout is driven to an L level.

In the present embodiment, the charge stored in respective body regions of MOS transistors 4 and 5 are drawn out via their sources in a standby mode period to reduce subthreshold leakage current $I_L$. Therefore, the layout area can be reduced in comparison to the conventional case where contact region 85 is provided to fix to the body region in order to reduce the threshold leakage current $I_L$.

The present invention is not limited to the present embodiment in which switches 6 and 7 are switched in a pulsive manner at a predetermined cycle in a standby mode. Constant conduction may be provided between terminals 6b and 6c of switch 6 and terminal 7b and 7c of switch 7 in a standby mode period. However, in this case, the operation time is delayed corresponding to the time for node N1 to be driven from boosted potential Vpp to power supply potential Vcc and node N2 to be driven from negative potential Vbb to ground potential Vss. Furthermore, it is to be noted that current consumption during the standby mode increases.

Although the source potential of MOS transistors 4 and 5 is switched in a standby mode in a present embodiment, a similar effect can be achieved even when switched in a power down mode, a battery backup mode, or a sleep mode.

[Second Embodiment]

Figure 5:
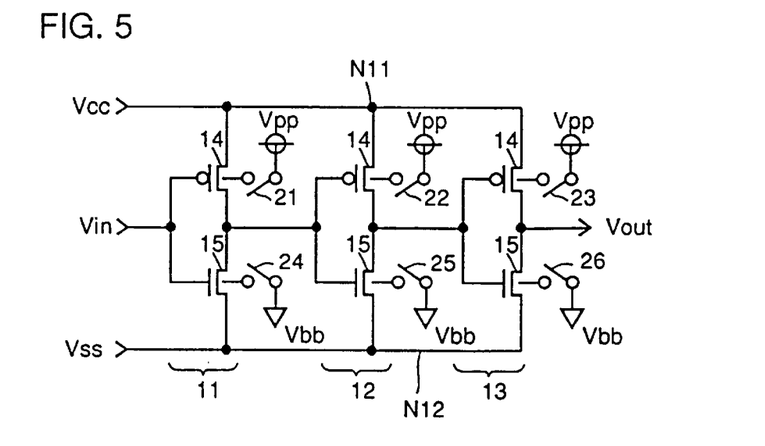
FIGS. 5 and 6 are circuit diagrams showing structures of a main components of an integrated semiconductor device according to second and third embodiments, respectively, of the present invention.

Referring to FIG. 5, an integrated semiconductor device according to a second embodiment of a present invention includes a plurality (three in the figure) of CMOS inverters 11–13 connected in series, formed on an SOI substrate, and switches 21–26. Each of inverters 11–13 includes a p channel MOS transistor 14 and an n channel MOS transistor 15 connected in series between nodes N11 and N12. Input signal Vin is supplied to inverter 11 which is the first-stage inverter. Output signal Vout is provided from inverter 13 which is the last-stage inverter.

Each of switches 21–23 has one terminal connected to the body of p channel MOS transistor 14 of inverters 11–13, respectively, and the other terminal receiving boosted potential Vpp. Each of switches 24–26 has one terminal connected to be the body of n channel MOS transistor 15 of inverters 11–13, respectively, and the other terminal receiving negative potential Vbb.

The operation of the circuit of FIG. 5 will be described hereinafter.

In a standby mode period, all switches 21–26 are rendered conductive. The body of p channel MOS transistor 14 of inverters 11–13 is fixed at boosted potential Vpp. The body of n channel MOS transistor 15 of inverters 11–13 is fixed at negative potential Vbb. In an active mode period, all switches 21–26 are rendered non-conductive, whereby the bodies of MOS transistors 14 and 15 of inverters 11–13 attain a floating state. Since the operation of the row of inverters 11–13 is similar to that of the row of the inverters 1–3 shown in FIG. 2, description thereof will not be repeated.

According to the second embodiment, the body potential of MOS transistors 14 and 15 are fixed in a standby mode period to have the subthreshold leakage current $I_L$ reduced, and the body of MOS transistors 14 and 15 are set to a floating state, whereby the capacitance across the body and the source/drain is reduced to increase the switching speed. Thus, reduction in current consumption and increase in operation speed can both be realized.

Although boosted potential Vpp and negative potential Vbb are applied to the body of p channel MOS transistor 14 and n channel MOS transistor 15, respectively, in a standby period in the present embodiment, power supply potential Vcc and ground potential Vss can be applied to the body of p channel MOS transistor 14 and n channel MOS transistor 15, respectively.

In the present embodiment, switches 21–26 are rendered conductive during the entire period of the standby mode. Alternatively, switches 21–26 may be rendered conductive in a pulsive manner at a predetermined cycle, as in the first embodiment.

[Third Embodiment]

Figure 6:
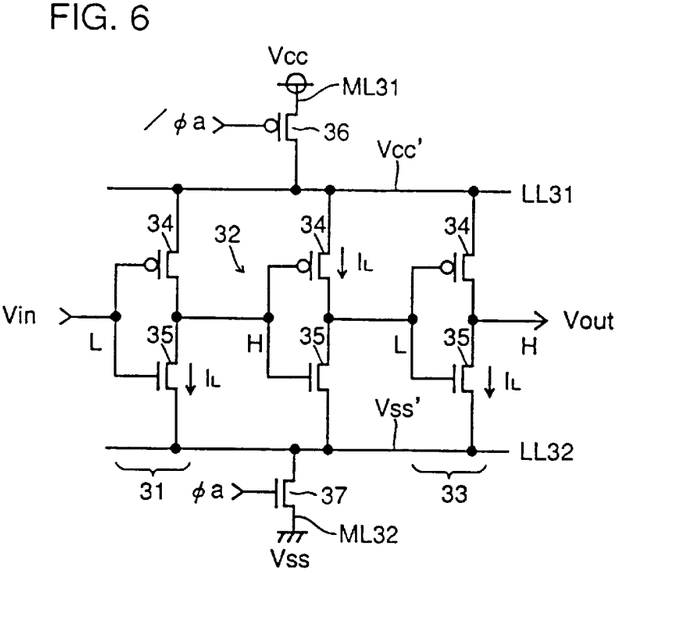

Referring to FIG. 6, an integrated semiconductor device of a third embodiment of the present invention includes a plurality (three in the figure) of CMOS inverters 31–33 connected in series and formed on an SOI substrate, a p channel MOS transistor 36, and an n channel MOS transistor 37. Each of inverters 31–33 includes a p channel MOS transistor 34 and an n channel MOS transistor 35 connected in series between local power supply lines LL31 and LL32. Input signal Vin is supplied to inverter 31 of the first stage, and output signal Vout is provided from inverter 33 of the last stage.

P channel MOS transistor 36 is connected between a main power supply line ML31 and a local power supply line LL31, and has a gate receiving an activation signal /φa. N channel MOS transistor 37 is connected between a main power supply lines ML32 and local power supply line ML32, and has a gate receiving an activation signal φa. Main power supply lines ML31 and ML32 are supplied with power supply potential Vcc and ground potential Vss, respectively.

When activation signals /φa and φa attain the activation levels of L and H, respectively, in an active period, MOS transistors 36 and 37 conduct, whereby inverters 31–33 are activated.

In this circuit, inverters 31–33 are disconnected from power supply potential Vcc and ground potential Vss during a standby mode period. Therefore, current will not flow to the power supply even when there is a flow of subthreshold leakage current $I_L$ to MOS transistors 34 and 35 forming inverters 31–33 as long as the threshold voltage of MOS transistors 36 and 37 is set to a high value. Thus, current consumption can be reduced in a standby mode.

The circuit per se (excluding the feature of being formed on an SOI substrate) is disclosed in "1V High-Speed Digital Circuit Technology with 0.5 μm Multi-Threshold CMOS," Proc. IEEE ASIC Conf., 1993, pp. 186–189. Application of the present invention to this circuit allows a higher performance.

Figure 8:
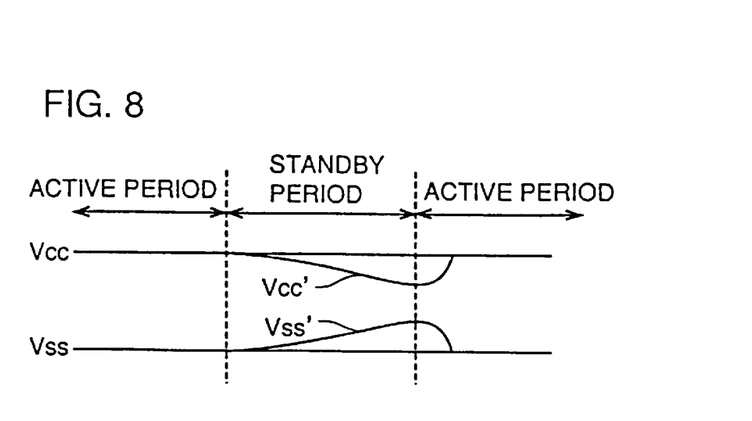
FIG. 8 is a diagram for describing the effect of the circuit shown in FIG. 6.

More specifically, as described in the aforementioned document, potential Vcc' of local power supply line LL31 will gradually decrease and potential Vss' of local power supply line LL32 will gradually increase in a standby mode period due to subthreshold leakage current $I_L$ as shown in FIG. 8 if activation signals /φa and φa are simply rendered inactive and active in a standby period and an active mode period, respectively. The time for local power supply lines LL31 and LL32 to be restored to power supply potential Vcc and ground potential Vss, respectively, at the next transition to an active mode is required.

Figure 7:
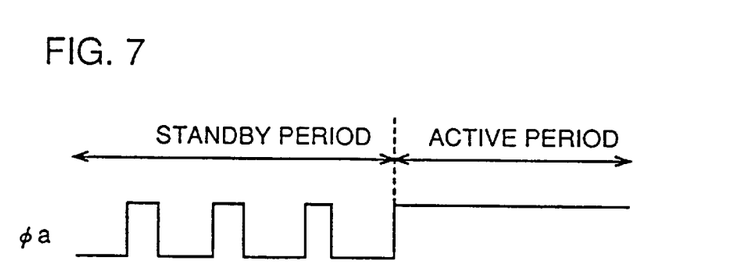
FIG. 7 is a timing chart for describing an operation of the circuit shown in FIG. 6.

In the third embodiment, activation signals /φa and φa are rendered active in a pulsive manner at a predetermined cycle even in a stand mode period to render MOS transistors 36 and 37 conductive in a pulsive manner to maintain the potential of local power supply lines LL31 and LL32 at power supply potential Vcc and ground potential Vss, respectively, as shown in FIG. 7.

Accordingly, the body potential of p channel MOS transistor 34 is increased and the body potential of n channel MOS transistor 35 is reduced, whereby subthreshold leakage current $I_L$ of MOS transistors 34 and 35 can be reduced. Also, transition from a standby mode to an active mode is facilitated.

[Fourth Embodiment]

Figure 9:
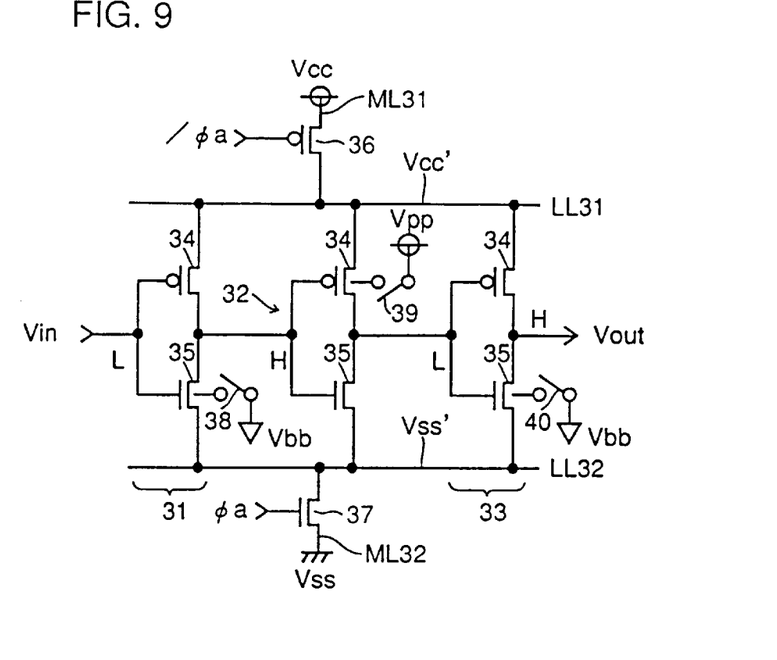
FIGS. 9 and 10 are circuit diagrams showing structures of a main component of an integrated semiconductor device according to fourth and fifth embodiments, respectively, of the present invention.

An integrated semiconductor device according to a fourth embodiment of a present invention is shown in FIG. 9.

Figure 10:
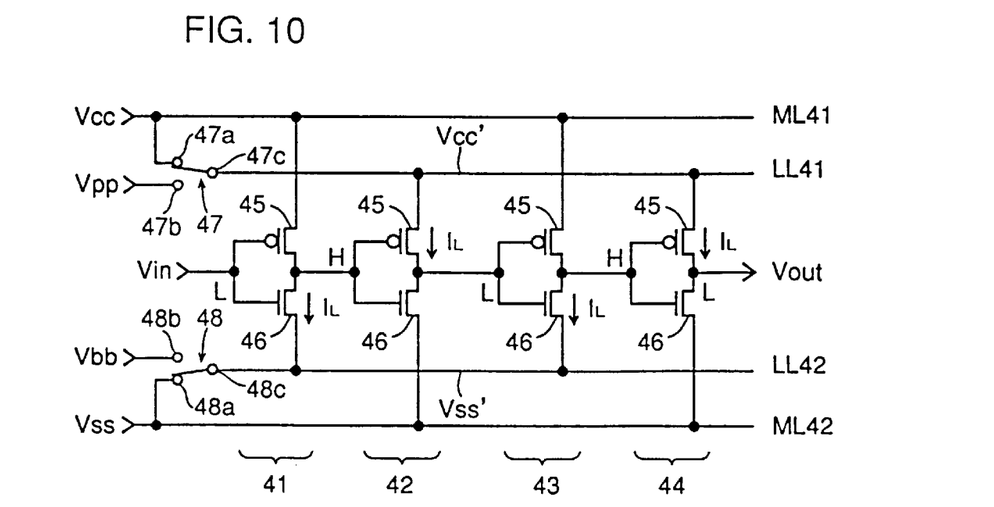

The integrated semiconductor device of FIG. 10 differs from the integrated semiconductor device of FIG. 6 in that switches 38–40 are additionally provided corresponding to N channel MOS transistor 35 of inverters 31 and 33 and p channel MOS transistor 34 of inverter 32 rendered non-conductive in a standby mode period. Switch 38 has one terminal connected to the body of n channel MOS transistor 35 of inverter 31, and the other terminal supplied with negative potential Vbb. Switch 39 has one terminal connected to the body of p channel MOS transistor 34 of inverter 32, and the other terminal supplied with boosted potential Vbb. Switch 40 has one terminal connected to the body of n channel MOS transistor 35 of inverter 33, and the other terminal supplied with negative potential Vbb.

The operation of the circuit of FIG. 9 will be described hereinafter. In a standby mode period, switches 38–40 conduct, whereby the body potential of n channel MOS transistor 35 of inverters 31 and 32 and the body potential of p channel MOS transistor 34 of inverter 32 are fixed at negative potential Vbb and boosted potential Vpp, respectively. In an active mode period, switches 38–40 are rendered non-conductive, whereby the body of MOS transistors 34 and 35 of inverters 31–33 attain a floating state. The remaining operation is similar to that of the circuit shown in FIGS. 6–8, and their description will not be repeated.

The present fourth embodiment provides effects similar to those of the second embodiment.

[Fifth Embodiment]

Referring to FIG. 10, an integrated semiconductor device according to a fifth embodiment of the present invention includes a plurality (four in the figure) of CMOS inverters 40–44 connected in series, and formed on an SOI substrate. Each of inverters 41 and 44 includes a p channel MOS transistor 45 and an n channel MOS transistor 46 connected in series between a main power supply line ML41 and a local power supply line LL41. Each of inverters 42 and 44 includes a p channel MOS transistor 45 and an n channel MOS transistor 46 connected in series between a local power supply line LL41 and a main power supply line ML42. Local power supply line LL41 receives power supply potential Vcc via main power supply line ML41. Ground potential Vss is supplied to local power supply line LL42 via main power supply line ML42.

Input signal Vin is applied to the first-stage inverter 41, and output signal Vout is provided from the last-stage inverter 44. Input signal Vin is switched to an L level in a standby mode and attains an H level in an active mode.

In a standby mode period, n channel MOS transistor 46 of inverter 43, for example, has its gate applied with ground potential Vss from main power supply line ML42, and its source supplied with ground potential Vss from local power supply lines LL42. As potential Vss' of local power supply line LL42 increases by the threshold leakage current $I_L$ of n channel MOS transistor 46, the gate potential of n channel MOS transistor 46 becomes lower than the source potential, whereby the threshold leakage current $I_L$ is reduced. In a similar manner, subthreshold leakage current $I_L$ is reduced in p channel MOS transistor 45.

The circuit per se (excluding the point being formed on SOI substrate) is disclosed in 1993 Symposium on VLSI Circuit Digest of Technical Papers, pp 47–48. Application of the present invention to this circuit allows further reduction of subthreshold leakage current $I_L$.

More specifically, in this integrated semiconductor device, switches 47 and 48 are further provided. Switch 47 has a common terminal 47c connected to a local power supply line LL41, its one switching terminal 47a connected to main power supply line ML41, and its other switching terminal 47b supplied with boosted potential Vpp. Switch 48 has a common terminal 48c connected to local power supply line LL42, its one switching terminal 48a connected to main power supply wire ML42, and its other switching terminal 48b supplied with negative potential Vbb.

Figure 11:
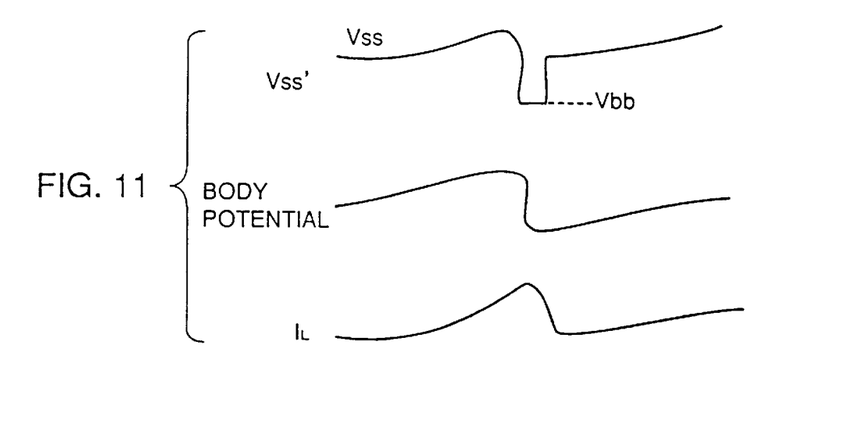
FIG. 11 is a timing chart for describing an operation of the circuit of FIG. 10.

As shown in FIG. 11, in a standby mode period, potential Vss' of local power supply line LL42 rises in response to subthreshold leakage current $I_L$, and the body potential of n channel MOS transistor 46 of inverters 41 and 43 rises to increase subthreshold leakage current $I_L$. Here, switch 48 is switched for only a predetermined time to provide negative potential Vbb to local power supply line LL42, in a pulsive manner. As a result, the body potential of p channel MOS transistor 46 of inverters 41 and 43 is lowered to reduce subthreshold leakage current $I_L$.

Similarly, when potential Vcc' of local power supply line LL41 is reduced in response to the threshold leakage current $I_L$ and the body potential of p channel MOS transistor 45 of inverters 42 and 44 is reduced to increase subthreshold leakage current $I_L$, switch 47 is switched for only a predetermined time period to apply boosted potential Vpp to local power supply line LL41 in a pulsive manner. As a result, the body potential of p channel MOS transistor 45 of inverters 42 and 44 can be reduced to lower subthreshold leakage current $I_L$.

Effects similar to those of the first embodiment can be obtained in the present embodiment.

If potential Vss' of local power supply line LL42 becomes excessively lower than ground potential Vss, n channel MOS transistor 46 that should be rendered non-conductive conducts. If potential Vcc' of local power supply line LL41 becomes excessively higher than power supply potential Vcc, p channel MOS transistor 45 that should be rendered non-conductive conducts. Therefore, it is necessary to set negative potential Vbb and boosted potential Vpp at appropriate values so that MOS transistors 45 and 46 that should be rendered non-conductive do not conduct.

[Sixth Embodiment]

Figure 12:
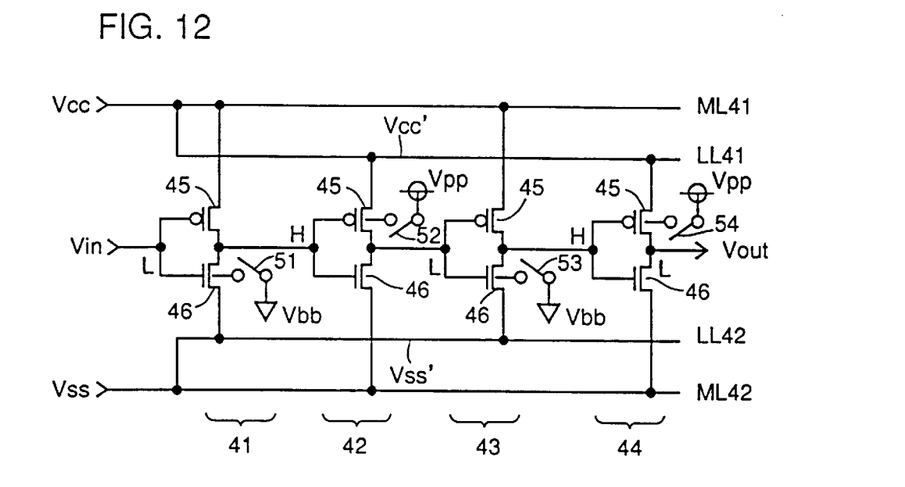
FIG. 12 is a circuit diagram showing a structure of a main component of an integrated semiconductor device according to a sixth embodiment of the present invention.

An integrated semiconductor device according to a sixth embodiment of the present invention is shown in FIG. 12.

The integrated semiconductor device of FIG. 12 differs from the integrated semiconductor device of FIG. 10 in that switches 47 and 48 are removed, local power supply lines LL41 and LL42 are directly connected to main power supply lines LL41 and LL42, respectively, and switches 51–54 are newly provided. Each of switches 51 and 53 has its one terminal connected to the body of n channel MOS transistor 46 of inverters 41 and 43, respectively, and its other terminal applied with negative potential Vbb. Each of switches 52 and 54 has one terminal connected to the body of p channel MOS transistor 45 of inverters 42 and 44, respectively, and its other electrode supplied with boosted potential Vpp.

The operation of the circuit of FIG. 12 will be described hereinafter. In a standby mode, switches 51–54 are rendered conductive, whereby the body of n channel MOS transistor 46 of inverters 41 and 43 is switched to negative potential Vbb. The body of p channel MOS transistor 45 of inverters 42 and 44 is fixed to boosted potential Vcc. In an active mode, switches 51–54 are rendered no-conductive, and the body of MOS transistors 45 and 46 of inverters 41–43 attain a floating state.

Effects similar to those of the second embodiment can be obtained in the present embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a standby mode and an active mode, formed on an SOI substrate, comprising:

an MOS transistor including a source region, a drain region, and a body region located between said source and drain regions, and source potential switching means to set a junction area between said body region and said source region of said MOS transistor at a forward bias state for supplying to said source region a predetermined potential to discharge stored charge from said body region to said source region at a predetermined time period of a period of said standby mode, and for supplying a power supply potential different from said predetermined potential to said source region at other periods.

2. The semiconductor device according to claim 1, wherein said source potential switching means applies said predetermined potential in a pulsive manner to said source region at a predetermined cycle in said period of said standby mode.

3. A semiconductor device formed on an SOI substrate, and including a standby mode and an active mode, comprising:

a plurality of inversion circuits connected in series, each including a p channel MOS transistor and an n channel MOS transistor having drains connected to each other, first source potential switching means for applying to a source of said p channel MOS transistor a boosted potential higher than a first power supply potential to discharge stored charge from a body region between source and drain regions of the p channel MOS transistor of each inversion circuit at a predetermined period in a period of said standby mode, and for applying said first power supply potential to the source of said p channel MOS transistor at other periods, and second source potential switching means for supplying to a source of said n channel MOS transistor a down-converted potential lower than a second power supply potential to discharge stored charge from a body region between source and drain regions of the n channel MOS transistor of each inversion circuit at a predetermined time in said period of said standby mode, and for applying said second power supply potential to the source of said n channel MOS transistor at other periods.

4. The semiconductor device according to claim 3 wherein said first source potential switching means supplies said boosted potential in a pulsive manner to the source of said p channel MOS transistor at a predetermined cycle in said period of said standby mode, and said second source potential switching means applies said down-converted potential in a pulsive manner to the source of said n channel MOS transistor at a predetermined cycle in said period of said standby mode.

5. A semiconductor device formed on an SOI substrate, and including a standby mode and an active mode, comprising:

a first main power supply line receiving an externally applied first power supply potential, a first sub-power supply line provided corresponding to said main power supply line, a second main power supply line receiving an externally applied second power supply potential, a second sub-power supply line provided corresponding to said second main power supply line, a plurality of inversion circuits connected in series, each including a p channel MOS transistor and an n channel MOS transistor connected in series between said first and second sub-power supply lines, first connection means connected between said first main power supply line and said first sub-power supply line, rendered conductive in a pulsive manner at a predetermined cycle in said standby mode, and constantly rendered conductive in a period of said active mode to apply said first power supply potential to said first sub-power supply line, and second connection means connected between said second main power supply line and said second sub-power supply line, rendered conductive in a pulsive manner at a predetermined cycle in a period of said standby mode and constantly rendered conductive in said active mode to apply said second power supply potential to said second sub-power supply line.

6. A semiconductor device formed on an SOI substrate, and including a standby mode and an active mode, comprising:

a plurality of inversion circuits connected in series, each including a p channel MOS transistor and an n channel MOS transistor having drains connected to each other, a first main power supply line, receiving an externally applied first power supply potential, connected to a source of a p channel MOS transistor out of said plurality of inversion circuits rendered conductive in a period of said standby mode, a second main power supply line, receiving an externally applied second power supply potential, connected to a source of an n channel MOS transistor of said plurality of inversion circuits rendered conductive in the period of said standby mode, a first sub-power supply line connected to a source of a p channel MOS transistor out of said plurality of inversion circuits rendered non-conductive in said period of said standby mode, a second sub-power supply line connected to a source of an n channel MOS transistor out of said plurality of inversion circuits rendered non-conductive in said period of said standby mode, first source potential switching means for supplying to said first sub-power supply line a boosted potential higher than said first power supply potential to discharge stored charge from a body region between source and drain regions of said p channel MOS transistor at a predetermined time period in said period of said standby mode, and for connecting said first main power supply line and said first sub-power supply line at other periods, and second source potential switching means for applying to said second sub-power supply line a down-converted potential lower than said second power supply potential to discharge stored charge from a body region between source and drain regions of said n channel MOS transistor at a predetermined period in said period of said standby mode, and for connecting said second main power supply line and said second sub-power supply line at other periods.

7. The semiconductor device according to claim 6, wherein
said first source potential switching means supplies said boosted potential in a pulsive manner to said first sub-power supply line at a predetermined cycle in said period of said standby mode, and
said second source potential switching means supplies said down-converted potential in a pulsive manner to said second sub-power supply line at a predetermined cycle in said period of said standby mode.

8. A semiconductor device formed on an SOI substrate, and including a standby mode and an active mode, comprising:
a MOS transistor including a source region, a drain region, and a body region located between source and drain regions, and
body potential switching means for fixing the body region of said MOS transistor to a predetermined potential at a predetermined period in a period of said standby mode, and for setting said body region to a floating state at other periods.

9. The semiconductor device according to claim 8, wherein said body potential switching means fixes said body region to said predetermined potential in a pulsive manner at a predetermined cycle in said period of said standby mode.

10. A semiconductor device formed on an SOI substrate, and including a standby mode and an active mode, comprising:
a plurality of inversion circuits connected in series, each including a p channel MOS transistor and an n channel MOS transistor connected in series between lines of first and second power supply potential
first body potential switching means for fixing a body region between source and drain regions of a p channel MOS transistor out of said plurality of inversion circuits that is rendered non-conductive at said standby mode to a boosted potential not lower than said first power supply potential at a predetermined period in a period of said standby mode, and for setting said body region to a floating state at other periods, and
second body potential switching means for fixing a body region located between source and drain regions of an n channel MOS transistor out of said plurality of inversion circuits rendered non-conductive at said period of said standby mode to a down-converted potential not higher than said second power supply potential at a predetermined period in said standby mode period, and for setting said body region to a floating state at other periods.

11. The semiconductor device according to claim 10, wherein
said first body potential switching means fixes the body region of said p channel MOS transistor to said boosted potential in a pulsive manner at a predetermined cycle in said period of said standby mode, and
said second body potential switching means fixes the body region of said n channel MOS transistor to said down-converted potential in a pulsive manner at a predetermined cycle in said period of said standby mode.

12. A semiconductor device formed on an SOI substrate, and including a standby mode and an active mode, comprising:
a first main power supply line receiving an externally applied first power supply potential,
a first sub-power supply line provided corresponding to said first main power supply line,
a second main power supply line receiving an externally applied second power supply potential,
a second sub-power supply line provided corresponding to said second main power supply line,
a plurality of inversion circuits connected in series, each including a p channel MOS transistor and an n channel MOS transistor connected in series between said first and second sub-power supply lines,
first connection means connected between said first main power supply line and said first sub-power supply line, rendered conductive at a period of said first active mode for providing said power supply potential to said first sub-power supply line,
second connection means connected between said second main power supply line and said second sub-power supply line, rendered conductive at said period of said standby mode for applying said second power supply potential to said second sub-power supply line,
first body potential switching means provided corresponding to a p channel MOS transistor out of said plurality of inversion circuits rendered non-conductive at a period of said standby mode for fixing a body region located between source and drain regions of a corresponding p channel MOS transistor to a boosted potential not lower than said first power supply potential at a predetermined period in said period of said standby mode, and for setting said body region to a floating state at other periods, and
second body potential switching means provided corresponding to an n channel MOS transistor out of said plurality of inversion circuits rendered non-conductive in said period of said standby mode, for fixing a body region located between source and drain regions of a corresponding n channel MOS transistor to a down-converted potential not higher than said second power supply potential at a predetermined period in said period of said standby mode, and for setting said body region to a floating state at other periods.

13. The semiconductor device according to claim 12, wherein
said first body potential switching means fixes the body region of said p channel MOS transistor to said boosted potential in a pulsive manner at a predetermined cycle in said period of said standby mode, and
said second body potential switching means fixes the body region of said n channel MOS transistor to said down-converted potential in a pulsive manner at a predetermined cycle in said standby mode.

14. A semiconductor device formed on an SOI substrate, and including a standby mode and an active mode, comprising:
a plurality of inversion circuits connected in series, each including a p channel MOS transistor and an n channel MOS transistor having drains connected to each other,
a first main power supply line, receiving an externally applied first power supply potential, and connected to a source of a p channel MOS transistor out of said plurality of inversion circuits rendered conductive in a period of said standby mode, a second main power supply line, receiving an externally applied second power supply potential, and connected to a source of an n channel MOS transistor out of said plurality of inversion circuits rendered conductive in said standby mode, a first sub-power supply line to which said first power supply potential from said first main power supply line is applied, and connected to a source of a p channel MOS transistor out of said plurality of inversion circuits rendered non-conductive in said period of said standby mode, a second sub-power supply line to which said second power supply potential is applied from said second main power supply line, and connected to a source of an n channel MOS transistor out of said plurality of inversion circuits rendered non-conductive in said period of said standby mode, first body potential switching means provided corresponding to a p channel MOS transistor out of said plurality of inversion circuits rendered non-conductive in said period of said standby mode, for fixing a body region located between source and drain regions of a corresponding p channel MOS transistor to a boosted potential not lower than said first power supply potential at a predetermined period in said period of said standby mode, and for setting said body region to a floating state at other periods, and second body potential switching means provided corresponding to an n channel MOS transistor out of said plurality of inversion circuits rendered non-conductive in said period of said standby mode, for fixing a body region located between source and drain regions of a corresponding n channel MOS transistor to a down-converted potential not higher than said second power supply potential at a predetermined period in said period of said standby mode, and for setting said body region to a floating state at other periods.

15. The semiconductor device according to claim 14, wherein said first body potential switching means fixes the body region of said p channel MOS transistor to said boosted potential in a pulsive manner at a predetermined cycle in said period of said standby mode, and said second body potential switching means fixes the body region of said n channel MOS transistor to said down-converted potential in a pulsive manner at a predetermined cycle in said standby mode.

16. A semiconductor device comprising:

a first logic circuit including (a) a first p channel MOS transistor having a gate coupled to a first input node receiving a first input signal, and a drain coupled to a first output node outputting a first output signal, and (b) a first n channel MOS transistor formed on an insulator, and having (b1) a gate coupled to the first input node, (b2) a source, (b3) a drain coupled to the first output node, and (b4) a body located between the source and drain of said first n channel MOS transistor;

a first line coupled to the source of said first n channel MOS transistor; and a first source potential applying means for applying a first source potential to said first line, the first source potential being rendered lower to drain out charge accumulated in the body of said first n channel MOS transistor via the source of said first n channel MOS transistor when the first input signal is rendered a low level.

17. The semiconductor device according to claim 16, wherein said semiconductor device has an active mode and a standby mode, and the first input signal is rendered the low level during said semiconductor device is in the standby mode.

18. The semiconductor device according to claim 16, further comprising:

a second logic circuit including (c) a second p channel MOS transistor formed on an insulator, and having (c1) a gate coupled to the first output node of said first logic circuit, (c2) a source, (c3) a drain coupled to a second output node outputting a second output signal, and (c4) a body located between the source and drain of said second p channel MOS transistor, and (d) a second n channel MOS transistor having a gate coupled to the first output node, and a drain coupled to the second output node;

a second line coupled to the source of said second p channel MOS transistor; and a second source potential applying means for applying a second source potential to said second line, the second source potential being rendered higher to drain out charge accumulated in the body of said second p channel MOS transistor when the first output signal is rendered a high level.

19. The semiconductor device according to claim 16, further comprising:

a second logic circuit including (c) a second p channel MOS transistor formed on an insulator, and having (c1) a gate coupled to a second input node receiving a second input signal, (c2) a source, (c3) a drain coupled to the first input node of said first logic circuit, and (c4) a body located between the source and drain of said second p channel MOS transistor, and (d) a second n channel MOS transistor having a gate coupled to the second input node, and a drain coupled to the first input node;

a second line coupled to the source of said second p channel MOS transistor; and a second source potential applying means for applying a second source potential to said second line, the second source potential being rendered higher to drain out charge accumulated in the body of said second p channel MOS transistor when the second input signal is rendered a high level.

20. A semiconductor device comprising:

a first logic circuit including (a) a first n channel MOS transistor having a gate coupled to a first input node receiving a first input signal, and a drain coupled to a first output node outputting a first output signal, and (b) a first p channel MOS transistor formed on an insulator, and having (b1) a gate coupled to the first input node, (b2) a source, (b3) a drain coupled to the first output node, and (b4) a body located between the source and drain of said first p channel MOS transistor;

a first line coupled to the source of said first p channel MOS transistor; and a first source potential applying means for applying a first source potential to said first line, the first source potential being rendered higher to drain out charge accumulated in the body of said first p channel MOS transistor via the source of said first p channel MOS transistor when the first input signal is rendered a high level.

* * * * *

UNITED STATES PATENT AND TRADEMARK OFFICE
CERTIFICATE OF CORRECTION

PATENT NO. : 6,100,563
DATED : August 8, 2000
INVENTOR(S) : Kazutami Arimoto

It is certified that error appears in the above-identified patent and that said Letters Patent is hereby corrected as shown below:

Title page,
Below Section [73], insert:
-- [*] Notice: This patent is subject to a terminal disclaimer. --

Signed and Sealed this

Eleventh Day of September, 2001

*Attest:*

NICHOLAS P. GODICI
*Acting Director of the United States Patent and Trademark Office*

*Attesting Officer*